(12) United States Patent
Luo

(10) Patent No.: US 10,931,166 B1
(45) Date of Patent: Feb. 23, 2021

(54) FLEXIBLE DISPLAY AND DISPLAY METHOD THEREOF

(71) Applicant: HUIZHOU CHINA STAR OPTOELECTRONICS TECHNOLOGY CO., LTD., Huizhou (CN)

(72) Inventor: Cong Luo, Huizhou (CN)

(73) Assignee: HUIZHOU CHINA STAR OPTOELECTRONICS TECHNOLOGY CO., LTD., Huizhou (CN)

(*) Notice: Subject to any disclaimer, the term of this patent is extended or adjusted under 35 U.S.C. 154(b) by 0 days.

(21) Appl. No.: 16/708,692

(22) Filed: Dec. 10, 2019

Related U.S. Application Data

(63) Continuation of application No. PCT/CN2019/116237, filed on Nov. 7, 2019.

(30) Foreign Application Priority Data

Sep. 10, 2019 (CN) .......................... 2019 1 0853611

(51) Int. Cl.
| | |
|---|---|
| *H05K 7/02* | (2006.01) |
| *H05K 7/04* | (2006.01) |
| *H02K 7/14* | (2006.01) |
| *H01F 7/06* | (2006.01) |

(Continued)

(52) U.S. Cl.
CPC .................. *H02K 7/14* (2013.01); *H01F 7/06* (2013.01); *H05K 5/0017* (2013.01); *H05K 5/0217* (2013.01)

(58) Field of Classification Search
USPC ........................................................ 361/807
See application file for complete search history.

(56) References Cited

U.S. PATENT DOCUMENTS

| | | | |
|---|---|---|---|
| 2008/0086925 A1 | 4/2008 | Yang | |
| 2013/0127799 A1* | 5/2013 | Lee | ........................ G06F 1/1652 345/204 |
| 2016/0132281 A1 | 5/2016 | Yamazaki et al. | |

(Continued)

FOREIGN PATENT DOCUMENTS

| | | |
|---|---|---|
| CN | 101163163 A | 4/2008 |
| CN | 105869522 A | 8/2016 |

(Continued)

*Primary Examiner* — Hung S. Bui
(74) *Attorney, Agent, or Firm* — Osha Bergman Watanabe & Burton LLP

(57) ABSTRACT

A flexible display and display method thereof, the flexible display including: a housing, a motor module, a display module, and a chain structure formed of a plurality of magnets; wherein the motor module is configured to switch the display module between the winding state and the extended state in a gravity direction, and the chain structure is disposed on a side of a non-display surface of the display module; wherein, when the display module is in the winding state, the plurality of magnets are separated from each other to be wound with the display module; when the display module is in the extended state, the plurality of magnets are attracted to each other and extended with the display module. The flexible display of the present disclosure can achieve mutual switching in both the winding state and the extended state in the direction of gravity.

10 Claims, 4 Drawing Sheets

(51) Int. Cl.
*H05K 5/02* (2006.01)
*H05K 5/00* (2006.01)

(56) References Cited

U.S. PATENT DOCUMENTS

| | | | |
|---|---|---|---|
| 2016/0231843 A1 | 8/2016 | Kim et al. | |
| 2017/0013726 A1 | 1/2017 | Han et al. | |
| 2017/0161868 A1 | 6/2017 | Kim et al. | |
| 2017/0325343 A1* | 11/2017 | Seo | G03B 21/58 |
| 2017/0332496 A1* | 11/2017 | Choi | G09F 9/301 |
| 2018/0011510 A1 | 1/2018 | Choi et al. | |
| 2019/0029131 A1 | 1/2019 | Han et al. | |
| 2020/0170129 A1 | 5/2020 | Han et al. | |

FOREIGN PATENT DOCUMENTS

| | | |
|---|---|---|
| CN | 106340254 A | 1/2017 |
| CN | 107111997 A | 8/2017 |
| CN | 108369789 A | 8/2018 |
| CN | 108417152 A | 8/2018 |
| CN | 108648628 A | 10/2018 |
| KR | 20180005299 A | 1/2018 |

\* cited by examiner

FLEXIBLE DISPLAY AND DISPLAY METHOD THEREOF

CROSS REFERENCES TO RELATED APPLICATIONS

This application is a continuation of PCT Application No. PCT/CN2019/116237, filed Nov. 7, 2019, which claims priority to Chinese Patent Application No. 201910853611.3, filed Sep. 10, 2019. The entire contents of these applications are incorporated herein by reference.

FIELD OF INVENTION

The present disclosure relates to the field of flexible display technologies, and more particularly, to a flexible display and a display method thereof.

BACKGROUND OF INVENTION

Currently, displays are one of the important tools for humans to acquire knowledge. Main forms of displays are flat display and curved display. However, with the continuous improvement of people life, users are more eager to acquire knowledge through large-size screens. However, the current display on the market is a rigid form of flat or curved surface, which cannot be folded storage.

With the continuous improvement of people's material requirements, users are more eager to acquire knowledge through large-size screens. However, current displays on the market are of a rigid form of flat or curved surface, which cannot be folded and stored. When the size of the display is too large, the display occupies people's living space. In addition, large-sized displays are more susceptible to impact by foreign objects, and the large-sized displays cannot meet the requirements of being portable and mobile.

SUMMARY OF INVENTION

The present disclosure provides a flexible display and display method thereof to solve the problems caused by the excessive size of the display in the prior art.

In order to solve the above problems, the present disclosure provides a flexible display comprising: a housing, a motor module, a display module, and a chain structure composed of a plurality of magnets, the housing enclosed to form an accommodating space, the display module connected to the motor module, wherein the motor module is configured to switch the display module in the winding state and the extended state in a gravity direction, and the chain structure is disposed on a side of a non-display surface of the display module; wherein, when the display module is in the winding state, the plurality of magnets are separated from each other to be winding with the display module; when the display module is in the extended state, the plurality of magnets be attracted to each other and extended with the display module.

In order to solve the above problems, the present disclosure provides a display method of a flexible display, the flexible display includes a housing, a motor module, a display module, and a plurality of magnets, the housing enclosed to forming an accommodating space, the motor module assembled in the accommodating space, the display module connected to the motor module, the plurality of magnets sequentially hinged together to form a chain structure disposed on a side of the non-display surface of the display module; wherein the display method includes: energizing the motor module to start rotating; driving the display module by the motor module to extend in a direction of gravity, each of the plurality of magnets attracted to each other to be fixed to each other; and displaying information on the display module.

The beneficial effects of the present disclosure are as follows: the flexible display of the present disclosure can be switched between the winding state and the extended state in the direction of gravity, thereby implementing diversification of the shape of the display, increasing portability and value of the products.

DETAILED DESCRIPTION OF PREFERRED EMBODIMENTS

The technical solutions in the embodiments of the present disclosure are clearly and completely described below. It is obvious that the described embodiments are not all of the embodiments of the present disclosure. All other embodiments obtained by those skill in the art without inventive effort are within the protective scope of the present disclosure.

References to "an embodiment" herein means that a particular feature, structure, or characteristic described in connection with the embodiments can be included in at least one embodiment of the present disclosure. The appearances of the phrases in various paragraphs in the specification are not necessarily referring to the same embodiments, and are not exclusive or alternative embodiments that are mutually exclusive. Those skilled in the art will explicitly and implicitly understand that the embodiments described herein can be combined with other embodiments.

Figure 1:
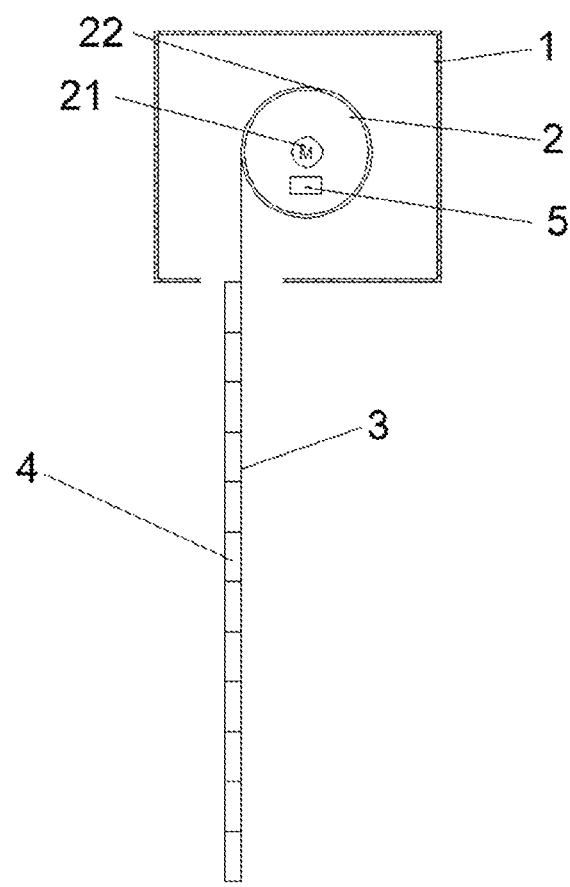
FIG. 1 is a schematic cross-sectional view showing an extended state of an embodiment of a flexible display provided by the present disclosure.
Figure 2:
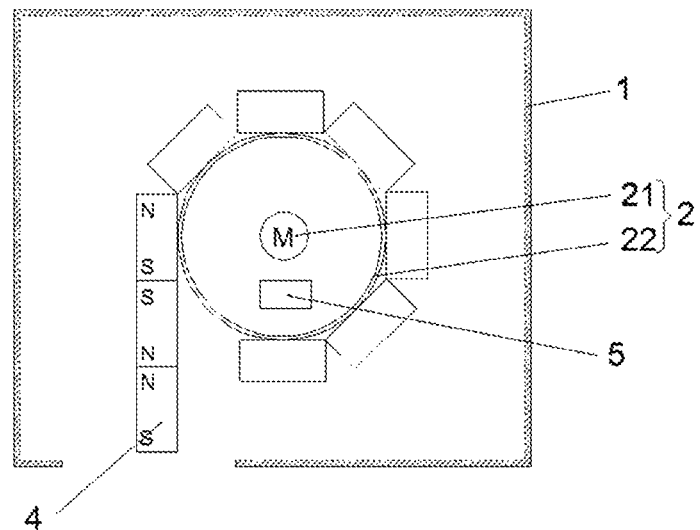
FIG. 2 is a schematic cross-sectional view showing a winding state of an embodiment of the flexible display provided by the present disclosure.

Please refer to FIG. 1 and FIG. 2, FIG. 1 is a schematic cross-sectional view showing an extended state of an embodiment of a flexible display provided by the present disclosure, and FIG. 2 is a schematic cross-sectional view showing a winding state of an embodiment of the flexible display provided by the present disclosure.

The present disclosure provides a flexible display comprising a housing 1, a motor module 2, a display module 3, and a chain structure 4.

The housing 1 is used to provide a closed working environment for the motor module 2, and to provide an accommodation space for the display module 3 and the chain structure 4 in the winding state; in this embodiment, the housing 1 is a rectangular parallelepiped or a cube. In other embodiments, the housing 1 may be a cylinder or other shape.

The lower plate of the housing 1 is provided with an opening to provide a movement path required for the display module 3 and the chain structure 4 to extend and wind.

The motor module 2 is assembled in the accommodating space; the display module 3 is connected to the motor module 2, and the motor module 2 is configured to switch the display module 3 in the winding state and the extended state in a gravity direction; a plurality of magnets 41 sequentially hinged together, that is the plurality of magnets 41 can rotate freely relative to each other, to form the chain structure 4 disposed on a side of a non-display surface of the display module, to support the display module 3.

As shown in FIG. 1, when the display module 3 is in the extended state, the plurality of magnets 41 are extended in the direction of gravity with the display module 3, and the plurality of magnets 41 are attracted and fixed to each other to form a flat plate, thereby supporting the display module 3. In addition, the plurality of magnets 41 straighten the display module 3 by its own gravity to ensure a flatness of the display module 3. As shown in FIG. 2, when the display module 3 is in the winding state, the plurality of magnets 41 are rotated relative to each other to achieve the objective of separation, so as to be wound together with the display module 3, and housed in the housing 1.

It can be understood that the plurality of magnets 41 can be permanent magnets or electromagnets.

In this embodiment, the display module 3 and the chain structure 4 can be mutually converted in the gravity direction from the winding state to the planar rigid extended state by the motor module 2. When the display module 3 is not used, the display module 3 and the chain structure 4 can be winded into the housing 1 to complete the hidden storage, thereby saving the placement space of the flexible display, and protecting the flexible display. When the display module 3 is used, it is flattened by the motor module, and the display module is rigid through the chain structure to meet the requirements of the display.

In addition, the flexible display of the present disclosure can be switched between the winding state and the extended state in the direction of gravity, thereby implementing diversification of the shape of the display, increasing portability and value of the product.

The motor module 2 includes a motor 21 and a reel 22; the reel 22 is connected to an output end of the motor 21, and when the motor 21 is in operation, the motor 21 is configured to drive the reel 22 to rotate, and the display module 3 is connected to the reel 22, thereby causing the display module 3 to switch between the winding state and the extended state in the direction of gravity.

Figure 3:
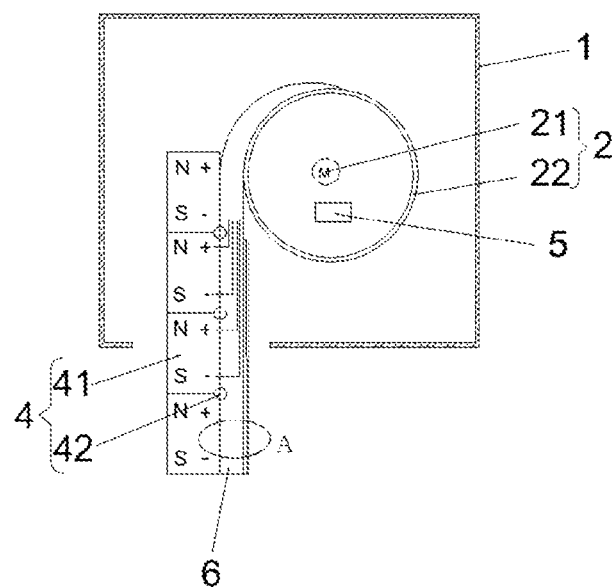
FIG. 3 is a schematic cross-sectional view showing an extended state of another embodiment of the flexible display provided by the present disclosure.
Figure 4:
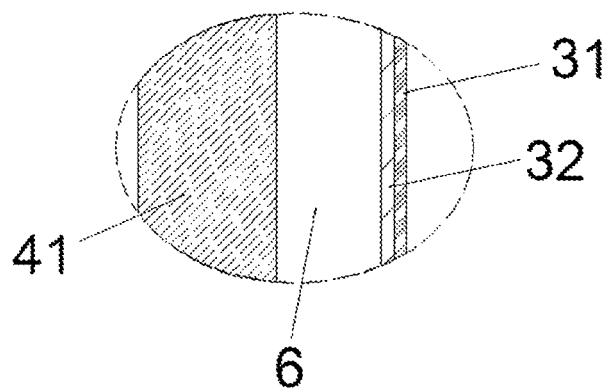
FIG. 4 is a partial schematic view of a region A in FIG. 3.

Please refer to FIG. 3 and FIG. 4, FIG. 3 is a schematic cross-sectional view showing an extended state of another embodiment of the flexible display provided by the present disclosure, and FIG. 4 is a partial schematic view of region A in FIG. 3.

The display module 3 includes a flexible screen 31 and a flexible substrate 32, the flexible screen 31 is attached to one side of the flexible substrate 32. The flexible substrate 32 is connected to the reel 22 of the motor module 2, and the chain structure 4 is disposed on a side of the flexible substrate 32 away from the flexible screen 31. When the motor 21 drives the reel 22 to rotate, the display module 3 exhibits two modes of extended state and winding state according to different rotation directions: in the extended mode, the display module 3 exhibits the extended state in the direction of gravity; in the winding mode, the display module 3 is rolled and attached to a roll.

The flexible display further includes a silicone pad 6 disposed on a side of the flexible substrate 32 away from the flexible screen 31, and the chain structure 4 is disposed on a side of the silicone pad 6 away from the flexible substrate 32. A material of the silicone pad 6 may be silicone gel. The chain structure 4 can absorb excess deformation and stress through the silicone pad 6 when the winding state and the extended state are mutually converted, so as to ensure the normal operation of the flexible display.

The silicone pad 6 has a hollow structure, and an inside of the silicone pad 6 is used to arrange circuits to have a hidden effect on the circuit.

The chain structure 4 includes the plurality of magnets 41 and hinges 42. In this embodiment, the respective magnets 41 are connected by respective hinges 42 to form the chain structure 4.

In this embodiment, the plurality of magnets 41 are the electromagnets 41. When the display module 3 is in the extended state, the plurality of electromagnets 41 are in an energized state to be attracted to each other and extended with the display module 3. When the display module 3 is in the winding state, the plurality of electromagnets 41 may be in a non-energized state. At this time, the plurality of electromagnets 41 are not magnetic, and the plurality of electromagnets 41 are separated from each other. Of course, when the display module 3 is in the winding state, the plurality of electromagnets 41 may also be in the energized state. At this time, the contacts of adjacent electromagnets 41 are magnetically opposite, and the adjacent electromagnets 41 are mutually repelled apart from each other.

The flexible display further includes a controller 5, the controller 5 is disposed inside the housing 1, and the controller 5 is electrically connected to the motor module 2 and the plurality of electromagnets 41, respectively; the controller 5 is used for controlling the rotation of the motor module 2, and is also for controlling the energized state of the plurality of electromagnets 41 in accordance with rotation angles of the motor module 2. The energized state includes a magnitude of a current and a direction of the current. It can be understood that the larger the current is, the greater the magnetism of the electromagnets 41 is, and the greater the attraction force of the adjacent electromagnets 41 is; when the direction of the current changes, the magnetism of the electromagnets 41 changes, so that the adjacent electromagnets 41 are mutually repelled.

Each of the electromagnets 41 is electrically connected to the controller 5, and the controller 5 controls the energized state of each of the electromagnets 41 respectively.

Figure 5:
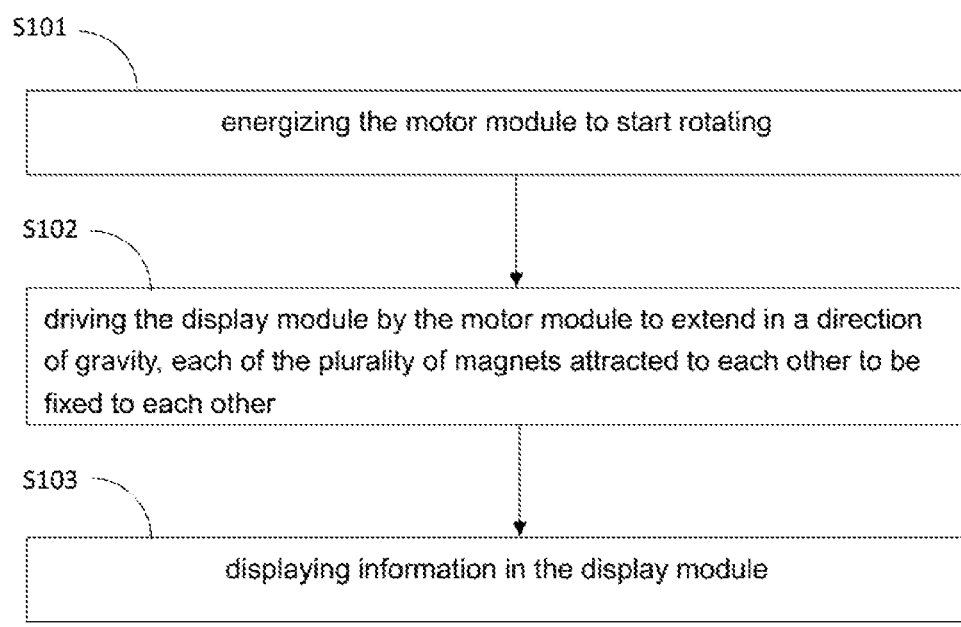
FIG. 5 is a schematic flowchart of an embodiment of the flexible display provided by the present disclosure.

Please refer to FIG. 2 and FIG. 5. FIG. 5 is a schematic flowchart of an embodiment of the flexible display provided by the present disclosure.

A display method of this embodiment is directed to the flexible display of the above embodiment. Steps of the display method include:

S101: energizing the motor module 2 to start rotating.

The motor module 2 may include the motor 21 and the reel 22; the reel 22 is connected to the output end of the motor 21, and the display module 3 is connected to the reel 22. When the motor 21 in operation, the motor 21 is configured to drive the reel 22 to rotate, thereby switching the display module 3 between the winding state and the extended state in the direction of gravity.

S102: driving the display module 3 by the motor module 2 to extend in the direction of gravity, and each of the plurality of magnets 41 is attracted to each other to be fixed to each other.

When the display module 3 is in the extended state, the plurality of magnets 41 are extended in the direction of gravity with the display module 3, and the plurality of magnets 41 are attracted and fixed to each other to form a flat plate, thereby supporting the display module 3. In addition, the plurality of magnets 41 straighten the display module 3 by their own gravity to ensure the flatness of the display module 3. When the display module 3 is in the winding state, the plurality of magnets 41 are rotated relative to each other to achieve the purpose of separation, so that they are wound together with the display module 3 and housed in the housing 1. It can be understood that the plurality of magnets 41 are permanent magnets or electromagnets.

S103: displaying information in the display module 3.

The display module 3 displays based on the input information.

Figure 6:
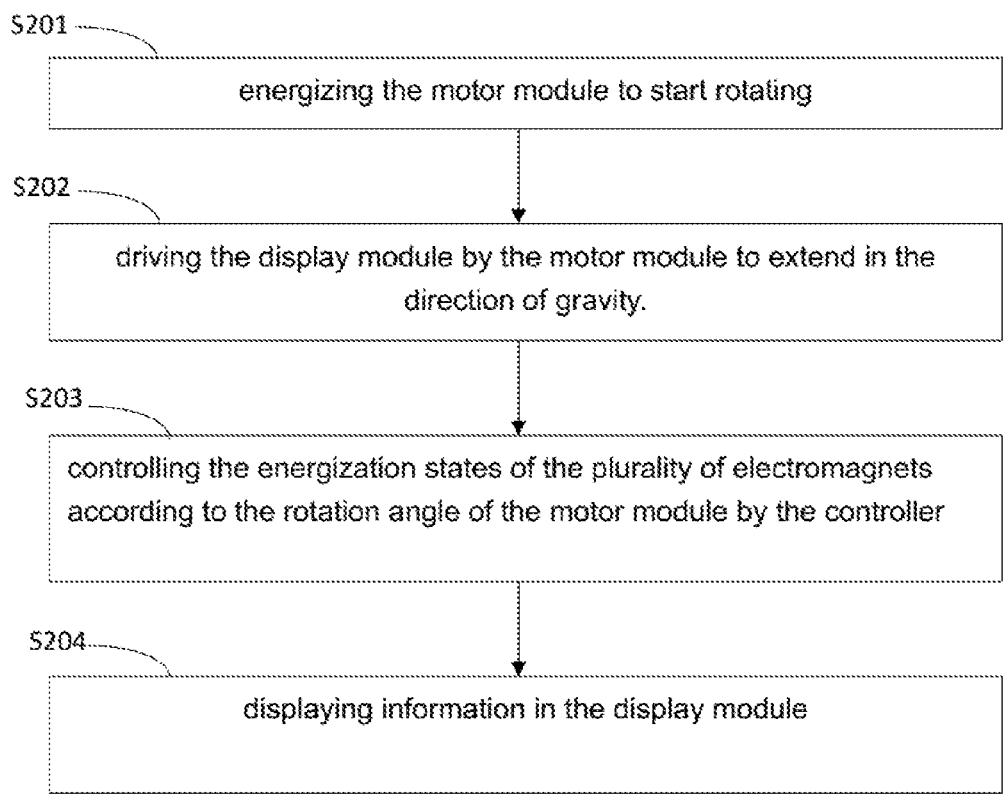
FIG. 6 is a schematic flowchart of another embodiment of the flexible display provided by the present disclosure.

Please refer to FIG. 6. FIG. 6 is a schematic flowchart of another embodiment of the flexible display provided by the present disclosure.

A display method of this embodiment is directed to the flexible display of the above embodiment. Steps of the display method include:

S201: energizing the motor module 2 to start rotating.

The motor module 2 may include the motor 21 and the reel 22; the reel 22 is connected to the output end of the motor 21, and the display module 3 is connected to the reel 22. When the motor 21 in operation, the motor 21 is configured to drive the reel 22 to rotate, thereby switching the display module between the winding state and the extended state in the direction of gravity.

S202: Driving the display module 3 by the motor module 2 to extend in the direction of gravity.

When the display module 3 is in the extended state, the plurality of magnets 41 are extended in the direction of gravity with the display module 3, and the plurality of magnets 41 are attracted and fixed to each other to form a flat plate, thereby supporting the display module 3. In addition, the plurality of magnets 41 straighten the display module 3 by their own gravity to ensure the flatness of the display module 3. When the display module 3 is in the winding state, the plurality of magnets 41 are rotated relative to each other to achieve the purpose of separation, so that they are wound together with the display module 3 and housed in the casing 1. When the display module 3 is in the winding state, the plurality of magnets 41 are rotated relative to each other to achieve the purpose of separation, so that they are wound together with the display module 3 and housed in the housing 1. It can be understood that the plurality of magnets 41 are electromagnets.

S203: Controlling the energized state of the plurality of electromagnets 41 according to the rotation angle of the motor module 2 by the controller 5.

The flexible display further includes the controller 5, the controller 5 is disposed inside the housing 1, and the controller 5 is electrically connected to the motor module 2 and the plurality of electromagnets 41, respectively; the controller 5 is used for controlling the rotation of the motor module 2, and also for controlling the energized state of the plurality of electromagnets 41 in accordance with the rotation angle of the motor module 2. The energized state includes the magnitude of the current and the direction of the current. It can be understood that the larger the current is, the greater the magnetism of the electromagnets 41 is, and the greater the attraction force of the adjacent electromagnets 41 is; when the direction of the current changes, and the magnetism of the electromagnets 41 changes, so that the adjacent electromagnets 41 are mutually repelled.

For example, in the process of gradually extending the plurality of electromagnets 41, the current is gradually increased, so that after the plurality of electromagnets 41 are fully extended, there is sufficient attraction force to ensure that each of the plurality of magnets 41 do not rotate with each other.

Each of the electromagnets 41 is electrically connected to the controller 5 respectively, so that the controller 5 controls the energized state of the respective electromagnets 41, thereby achieving the objective of accurately controlling the respective electromagnets 41.

For example, in the process of gradually extending the plurality of electromagnets 41, the current of the electromagnets 41 that protrudes from the housing 1 earlier is gradually increased, so that the electromagnets 41 that protrude from the housing 1 earlier have sufficient attraction to attract together, to ensure that each of the plurality of the electromagnets 41 that protrudes from the housing 1 earlier are not rotated with each other.

Each of the plurality of electromagnets 41 in the chain structure 4 can be individually controlled in polarity by the controller 5, and the polarity of the electromagnets 41 matches the rotation angle of the motor 21. During use, the controller 5 controls the rotation of the motor module 2, and the reel 22 drives the flexible substrate 32. The flexible substrate 32 passes through the opening of the housing 1 to form the extended state in the gravity plane; then, the controller 5 emits a signal to each of the electromagnets 41, so that the electromagnets 41 obtain phase-adsorption magnetism, and the electromagnets 41 attract each other, thereby obtaining rigidity of the display module 3. When usage ends, the controller 5 emits a signal to the motor module 2, and the motor module 2 drives the flexible substrate 32 to rotate in a direction which is opposite to the direction of rotation in the extended state; meanwhile, the controller 5 emits a signal to the electromagnets 41 according to the corresponding rotation angle, to make the electromagnets 41 be winded on the reel 22 to obtain repulsive magnetism, thereby making the display module 3 and the chain structure 4 flexible to facilitate curled containment.

S204: displaying information in the display module 3.

The display module 3 displays based on the input information.

The terms "first" and "second" in this application are used for descriptive purposes only, and are not to be construed as indicating or implying a relative importance or implicitly indicating the number of technical features indicated. Thus, features defining "first" or "second" may include at least one of the features, either explicitly or implicitly. In the description of the present application, the meaning of "a plurality" is at least two, such as two, three, etc., unless specifically defined otherwise. All directional indications (such as up, down, left, right, front, back, etc.) in the embodiments of the present application are only used to explain the relative positional relationship between components in a certain posture (as shown in the drawing), the movement situation, etc.; if the specific posture changes, the directional indication also changes accordingly. Furthermore, the terms "including", "comprising" and derivatives thereof are intended to cover a non-exclusive inclusion. For example, a process, method, system, product, or device that comprises a series of steps or components is not limited to the listed steps or components, but optionally includes steps or components not listed, or alternatively steps or components inherent to these processes, methods, products or devices are included.

The above description is only the embodiment of the present disclosure, and thus does not limit the scope of the present disclosure. The equivalent structure or equivalent process transformations made by the present specification and the contents of the drawings, or directly or indirectly applied to other related technical fields, are all included in the scope of patent protection of the present disclosure.

What is claimed is:

1. A flexible display, comprising:
   a housing enclosed to form an accommodating space;
   a motor module assembled in the accommodating space;
   a display module connected to the motor module, wherein the motor module is configured to switch the display module between a winding state and an extended state in a gravity direction; and
   a plurality of magnets sequentially hinged together to form a chain structure disposed on a side of a non-display surface of the display module, and the plurality of magnets are electromagnets;
   wherein when the display module is in the winding state, the plurality of magnets are separated from each other to be wound with the display module, when the display module is in the extended state, the plurality of magnets are in an energized state to be attracted to each other and extended with the display module;
   wherein the motor module comprises a motor and a reel, the reel is connected to an output end of the motor, the display module is connected to the reel, and the motor is configured to drive the reel to rotate to switch the display module between the winding state and the extended state;
   wherein the display module comprises a flexible screen and a flexible substrate, the flexible screen is attached to a side of the flexible substrate; and
   the chain structure is disposed on a side of the flexible substrate away from the flexible screen, wherein the flexible substrate is connected to the motor module.

2. A flexible display, comprising:
   a housing enclosed to form an accommodating space;
   a motor module assembled in the accommodating space;
   a display module connected to the motor module, wherein the motor module is configured to switch the display module between a winding state and an extended state in a gravity direction; and
   a plurality of magnets sequentially hinged together to form a chain structure disposed on a side of a non-display surface of the display module;
   wherein when the display module is in the winding state, the plurality of magnets are separated from each other to be wound with the display module, when the display module is in the extended state, each of the plurality of magnets is attracted to each other and extended with the display module;
   wherein the display module comprises a flexible screen and a flexible substrate, the flexible screen is attached to a side of the flexible substrate; and
   the chain structure is disposed on a side of the flexible substrate away from the flexible screen, wherein the flexible substrate is connected to the motor module.

3. The flexible display as claimed in claim 2, wherein the plurality of magnets are electromagnets;
   wherein when the display module is in the extended state, the plurality of magnets are in an energized state, and each of the plurality of magnets is attracted to each other.

4. The flexible display as claimed in claim 3, wherein the flexible display further comprises a controller, the motor module and the plurality of magnets are electrically connected to the controller, the controller is configured to control a rotation of the motor module, and the controller is further configured to control the energized state of the plurality of magnets according to a rotation angle of the motor module.

5. The flexible display as claimed in claim 4, wherein each of the plurality of magnets is electrically connected to the controller.

6. The flexible display as claimed in claim 2, wherein the motor module comprises a motor and a reel, the reel is connected to an output end of the motor, the display module is connected to the reel, and the motor is configured to drive the reel to rotate to switch the display module between the winding state and the extended state.

7. The flexible display as claimed in claim 2, wherein the flexible display further comprises a silicone pad disposed on the side of the flexible substrate away from the flexible screen, and the chain structure is disposed on a side of the silicone pad away from the flexible substrate.

8. The flexible display as claimed in claim 7, wherein the silicone pad has a hollow structure.

9. A display method of a flexible display, comprising:
   a housing, a motor module, a display module, and a plurality of magnets, the housing enclosed to form an accommodating space, the motor module assembled in the accommodating space, the display module connected to the motor module, and the plurality of magnets sequentially hinged together to form a chain structure disposed on a side of the non-display surface of the display module;
   wherein the display method comprises:
   energizing the motor module to start rotating;
   driving the display module by the motor module to extend in a direction of gravity, each of the plurality of magnets attracted to each other to be fixed to each other; and
   displaying information on the display module;
   wherein the display module comprises a flexible screen and a flexible substrate, the flexible screen is attached to a side of the flexible substrate; and
   the chain structure is disposed on a side of the flexible substrate away from the flexible screen, wherein the flexible substrate is connected to the motor module.

10. The display method as claimed in claim 9, wherein the plurality of magnets are electromagnets, the flexible display further comprises a controller, and the motor module and the plurality of magnets are respectively electrically connected to the controller;
    wherein the step of driving the display module by the motor module to extend in the direction of gravity and each of the plurality of magnets attracted to each other to be fixed to each other comprises:
    driving the display module by the motor module to extend in the direction of gravity, and controlling an energized state of the plurality of magnets by the controller according to a rotation angle of the motor module.

* * * * *